United States Patent [19]

Okumura

[11] Patent Number: 5,006,726
[45] Date of Patent: * Apr. 9, 1991

[54] PULSE GENERATOR INCLUDING COAXIAL TYPE CAPACITOR

[75] Inventor: Mitsunao Okumura, Nagaokakyo, Japan

[73] Assignee: Murata Manufacturing Co., Ltd., Japan

[*] Notice: The portion of the term of this patent subsequent to Jun. 27, 2006 has been disclaimed.

[21] Appl. No.: 348,811

[22] Filed: May 8, 1989

Related U.S. Application Data

[62] Division of Ser. No. 171,559, Mar. 22, 1988, Pat. No. 4,843,518.

[30] Foreign Application Priority Data

Mar. 23, 1987 [JP] Japan .............................. 62-042928[U]
Dec. 21, 1987 [JP] Japan .............................. 62-194342[U]

[51] Int. Cl.⁵ .......................... H03K 3/537; H01G 4/38
[52] U.S. Cl. ...................................... 307/108; 361/330
[58] Field of Search ........ 361/271, 301, 303, 328–330; 307/106–110, 246, 264–269, 296.3; 363/111, 112, 166, 167; 328/59–68; 331/126–128, 165, 166; 333/165–167, 172; 315/209 CD, 227 R, 227 A, 273, 275

[56] References Cited

U.S. PATENT DOCUMENTS

| | | | |
|---|---|---|---|
| 3,878,449 | 4/1975 | Wilhelmi et al. | 307/108 |
| 4,312,027 | 1/1982 | Stockman | 361/329 |
| 4,430,577 | 2/1984 | Bouquet | 307/108 |
| 4,517,497 | 5/1985 | Malone | 315/241 R |
| 4,680,671 | 7/1987 | Brion et al. | 361/329 |
| 4,843,518 | 6/1989 | Okumura | 361/330 |

*Primary Examiner*—A. D. Pellinen
*Assistant Examiner*—David Osborn
*Attorney, Agent, or Firm*—Ostrolenk, Faber, Gerb & Soffen

[57] ABSTRACT

A pulse generator which employs a coaxial type capacitor, including at least one capacitor from which an accumulated charge is discharged when a pulse is generated, and another capacitor for adjusting the waveform of the pulse to be outputted. The coaxial type capacitor in this pulse generator includes at least first, second and third capacitors which are arranged coaxially and adjacent to each other. The first and third capacitors are connected in parallel to form the discharging capacitor of the pulse generator, while the second capacitor is arranged between the first and third capacitors and is used as the waveform adjusting capacitor of the pulse generator. A current in the second capacitor flows in a direction opposite to the direction of currents in the first and third capacitors when a pulse is generated.

39 Claims, 10 Drawing Sheets

Co

Cf

PULSE GENERATOR INCLUDING COAXIAL TYPE CAPACITOR

This is a division of application Ser. No. 07/171,559, filed Mar. 22, 1988, now U.S. Pat. No. 4,843,518.

BACKGROUND OF THE INVENTION

1. Field of the Invention

The present invention relates to a coaxial type capacitor suitable for use in a pulse generator which is used for measuring electrical and/or mechanical properties of various electric and electronic devices.

2. Description of the Prior Art

Conventionally, a pulse generator having a structure as shown in FIG. 13 is well known. Namely, in the pulse generator, a discharge gap G to which a capacitor Co and a trigger terminal 1 are connected, a resistor $R_S$ for restraining a high-frequency oscillation generated upon discharge and a discharging resistor $R_O$ are connected so as to form a closed loop, and a capacitor $C_f$ is connected in parallel to the resistor $R_O$ which composes an output circuit together with the capacitor $C_f$. A pulse is generated across the resistor $R_O$ to which a coaxial connecting plug 3 of a coaxial cable 2 is connected for transmitting the generated pulse. The capacitor $C_O$ is charged through a charging resistor Rc by a direct current supplied from a charging terminal 4. Charge accumulated in the capacitor Co is discharged instantly through the discharge gap G, resistors $R_S$ and Ro and the capacitor $C_f$ at the moment that a trigger voltage is applied to the trigger terminal 1 of the discharge gap G and a pulse thus generated is outputted through the coaxial cable 2.

In order to obtain a fast rising property of the pulse, it is desirable to design the pulse generator so as to minimize the dimensions thereof and the total length of wiring. However, in the conventional pulse generator, the discharge gap G is formed with an air gap or a vacuum tube having relatively large dimensions and, further, bulky capacitors of normal type, each of which is housed in a metal case, are used as capacitors Co and Cf, as shown in FIGS. 14(a) and 14(b), and are connected independently according to the wiring diagram shown in FIG. 13. Accordingly, the length of wiring becomes long and this causes the inductance thereof to increase inevitably. As shown in FIG. 15 which shows an equivalent circuit of the pulse generator at the time of discharge of the capacitor Co, a residual inductance L of about 1.0 $\mu$H~3.0 $\mu$H is generated on the way of discharge by the wiring. The residual inductance can be reduced by improving structures of the pulse generator, but it cannot be reduced lower than 0.6 $\mu$H~0.7 $\mu$H. Due to this residual inductance, a high-frequency oscillation is superposed upon a pulse to be outputted and, therefore, the quality of the pulse becomes inferior.

As mentioned above, the resistor $R_S$ is inserted between the discharge gap G and the capacitor $C_f$ for restraining a high-frequency oscillation in the conventional pulse generator assuming that a residual inductance of 1.0 $\mu$H~3.0 $\mu$H is inevitable. However, the resistor $R_S$ must have a high resistance in order to restrain the high-frequency oscillation effectively. Due to this, the rising property (waveform) of a pulse which is generated by the pulse generator becomes dull and the output impedance of the pulse generator becomes high. For reference, the rising time of a pulse is about 1 $\mu$S at the minimum according to the conventional pulse generator.

SUMMARY OF THE INVENTION

One object of the present invention is to provide a coaxial type capacitor suitable for use in a pulse generator.

Another object of the present invention is to provide a coaxial type capacitor which includes both capacitors needed for a circuit of a pulse generator.

A further object of the present invention is to provide a coaxial type capacitor capable of reducing a residual inductance of a pulse generator remarkably.

In order to achieve these objects, according to the present invention, there is provided a coaxial type capacitor for a pulse generator including at least a capacitor for discharging charge accumulated therein upon generating a pulse and a capacitor for adjusting waveform of a pulse to be outputted, being characterized in that said coaxial type capacitor includes first, second and third capacitors which are arranged coaxially and adjacently with each other and that said first and third capacitors arranged with said second capacitor in between them, are connected in parallel so as to form the discharging capacitor of the pulse generator while said second capacitor is used for the waveform adjusting capacitor.

BRIEF DESCRIPTION OF DRAWINGS

These and other objects and features of the present invention will become more apparent when the preferred embodiments of the present invention are described in detail, with reference to the accompanied drawings in which.

DETAILED DESCRIPTION OF THE PREFERRED EMBODIMENTS

Figure 1:
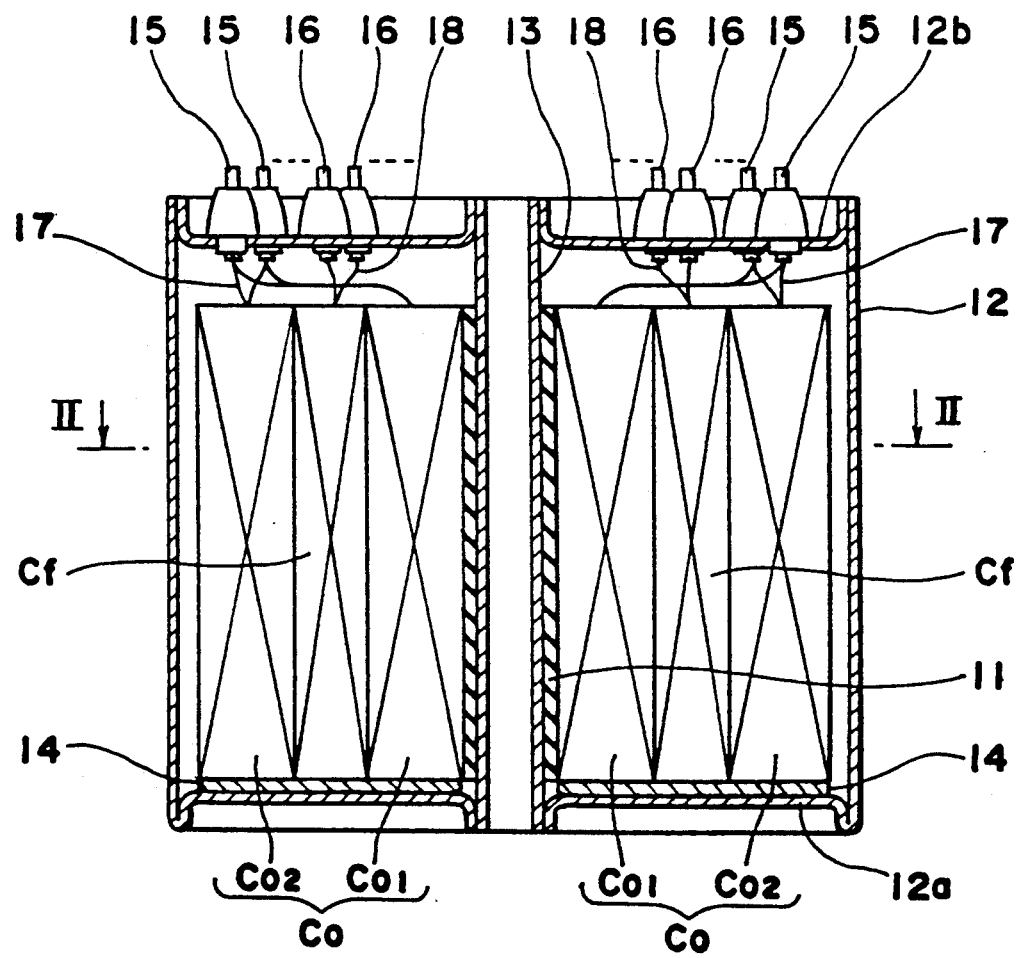
FIG. 1 is a cross sectional view of a coaxial type capacitor according to the present invention.
Figure 2:
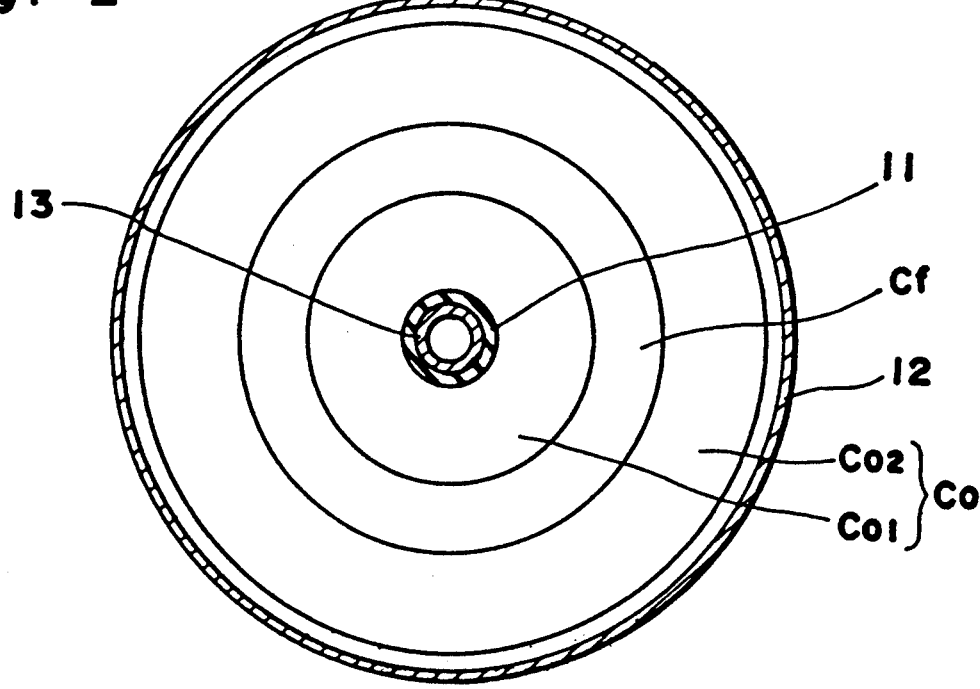
FIGS. 2 is a cross sectional view along line II—II of FIG. 1.
Figure 3:
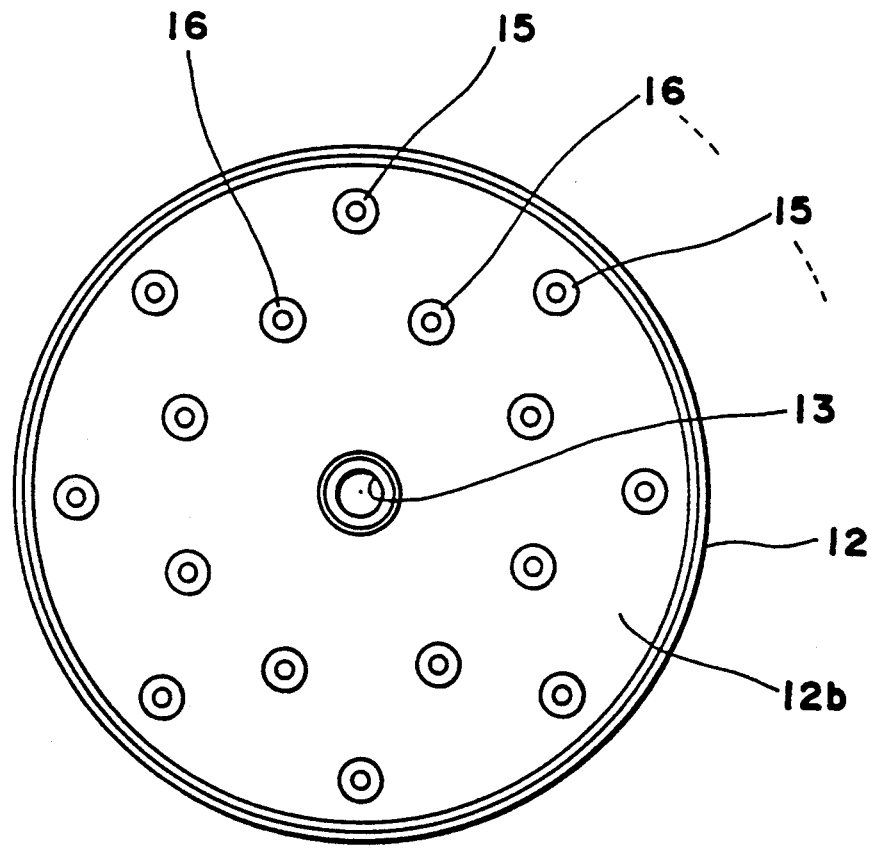
FIG. 3 is a plan view of the coaxial type capacitor shown in FIG. 1.

FIG. 1 shows a vertical cross section of a coaxial type capacitor according to one preferred embodiment of the present invention. FIG. 2 shows a horizontal cross section along line II—II in FIG. 1 and FIG. 3 shows a plan view of the coaxial type capacitor.

The coaxial type capacitor according to the present invention is essentially comprised of three cylindrical film capacitors $C_{O1}$, $C_f$ and $C_{O2}$ having been arranged coaxially. The structure of each film capacitor itself is well known to those skilled in the art.

Figure 13:
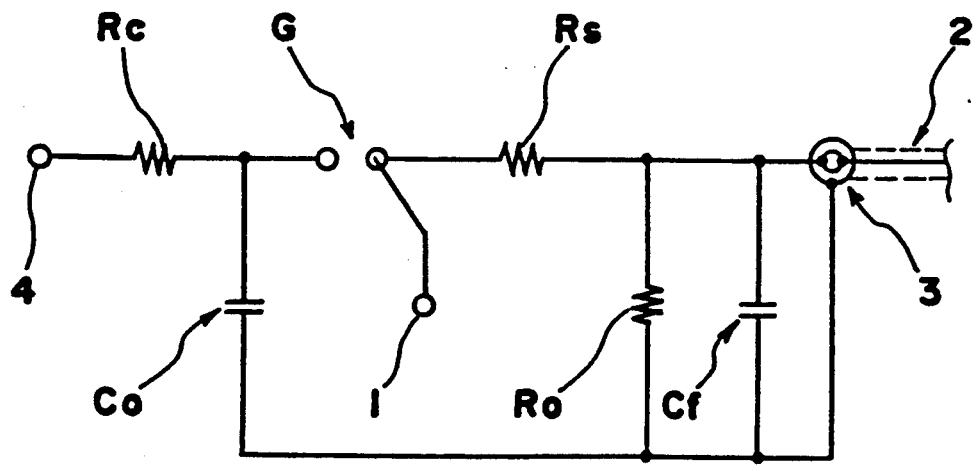
FIG. 13 is an equivalent circuit of a conventional pulse generator.

The inner capacitor $C_{O1}$ fixed around a pipe-like bobbin 11 made of resin and the outer capacitor $C_{O2}$ arranged around the intermediate $C_f$ are connected with each other so as to form one capacitor $C_O$ (hereinafter, referred to as the first capacitor Co), which is equivalent to the discharge capacitor Co shown in FIG. 13. The intermediate capacitor $C_f$ (hereinafter referred to the second capacitor) arranged between the inner and outer capacitors $C_{O1}$ and $C_{O2}$ is also equivalent to the capacitor $C_f$ shown in FIG. 8. These three film capacitors $C_{O1}$, $C_f$ and $C_{O2}$ can be made separately and, thereafter, assembled to form a coaxial capacitor unit.

The coaxial capacitor unit comprised of the first and second capacitors Co and Cf is contained in a cylindrical metal case 12. The metal case 12 has a cylindrical pipe 13 coaxially inserted at the center thereof. The bobbin 11 of the inner capacitor $C_{O1}$ is fitted to the pipe 13 on the outside thereof and, thereby, the coaxial capacitor unit is supported by the pipe 13. A respective first electrode of each of the pairs of electrodes of the capacitors $C_{O1}$, $C_f$ and $C_{O2}$ is bonded to a base plate 12a of the metal case 12 with solder 14.

As shown in FIGS. 1 and 3, on a cover plate 12b of the metal case 12, eight output terminals 15 for the first capacitor Co are arranged at a predetermined distance from the center of the plate 12b and at an equal angular pitch and, also, eight output terminals 16 for the second capacitor $C_f$ are arranged inside of the terminals 16 at a constant distance from the center and at an equal angular pitch. To each of the output terminals 16, respective second electrodes of the inner and outer capacitors $C_{O1}$ and $C_{O2}$ are connected by lead wires 17. Also, a second electrode of the intermediate capacitor (the second capacitor) $C_f$ is connected to each of the output terminals 16 by lead wires 18. It is desirable to provide as many respective output terminals 15 and 16 as possible since the residual inductance decreases as the number of the output terminals increases.

Figure 4:
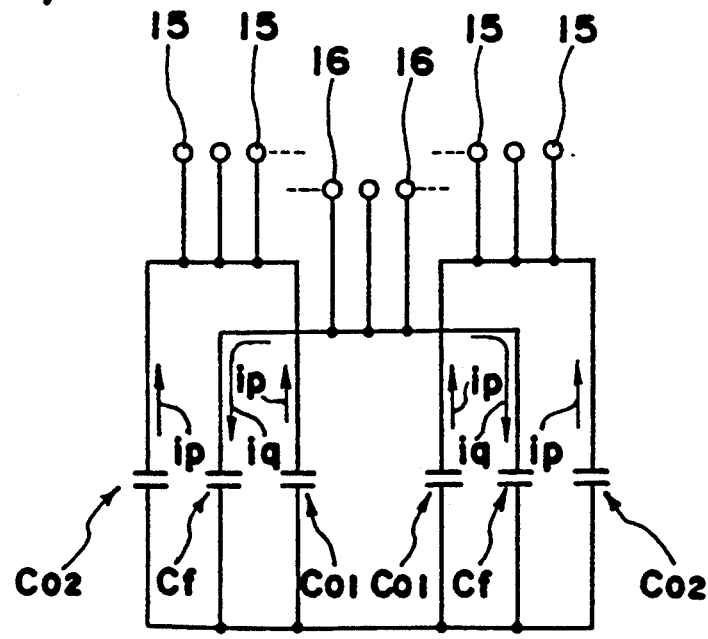
FIG. 4 is an equivalent circuit of the coaxial type capacitor shown in FIG. 1.

FIG. 4 shows an equivalent circuit of the coaxial capacitor according to the embodiment shown in FIGS. 1-3.

First of all, it is to be noted that the direction of the currents ip which are generated upon discharge of the first capacitor Co ($C_{O1}$ and $C_{O2}$) is opposite to the direction of the current iq flowing into the second capacitor $C_f$. Further, it is to be noted that the discharge currents ip generated in the inner and outer capacitor $C_{O1}$ and $C_{O2}$ flow inside and outside of the second capacitor Cf in the opposite direction to the current iq of the latter.

Due to these reasons, any inductance caused by the flow path of the discharge current ip is cancelled by that caused by the flow path of the current iq in the second capacitor $C_f$.

Accordingly, the residual inductance can be reduced considerably in the coaxial capacitor according to the present embodiment and, therefore, a pulse generator can generate a pulse of high quality having a fast rising waveform and reduced high frequency oscillation if this coaxial capacitor is employed therein.

According to the present preferred embodiment, the measured residual inductance L is about 20 nH in the case where $C_O = 20 \mu F/3$ KV and $C_f = 0.5 \mu F/3$ KV. In contrast to the above, if a coaxial capacitor comprised of two cylindrical capacitors of 20 $\mu F/3$ KV and 0.5 $\mu F/3$ KV is used in place of the coaxial capacitor comprised of three cylindrical capacitors, the measured residual inductance is increases to about 30 nH. In other words, the residual inductance of the coaxial capacitor according to the present preferred embodiment of the present invention is reduced by 30% as compared to that of the coaxial capacitor comprised of two cylindrical capacitors.

It is to be noted that capacitors are not restricted to being film capacitors in the present invention as is easily understood from the principle of the present invention.

Figure 5:
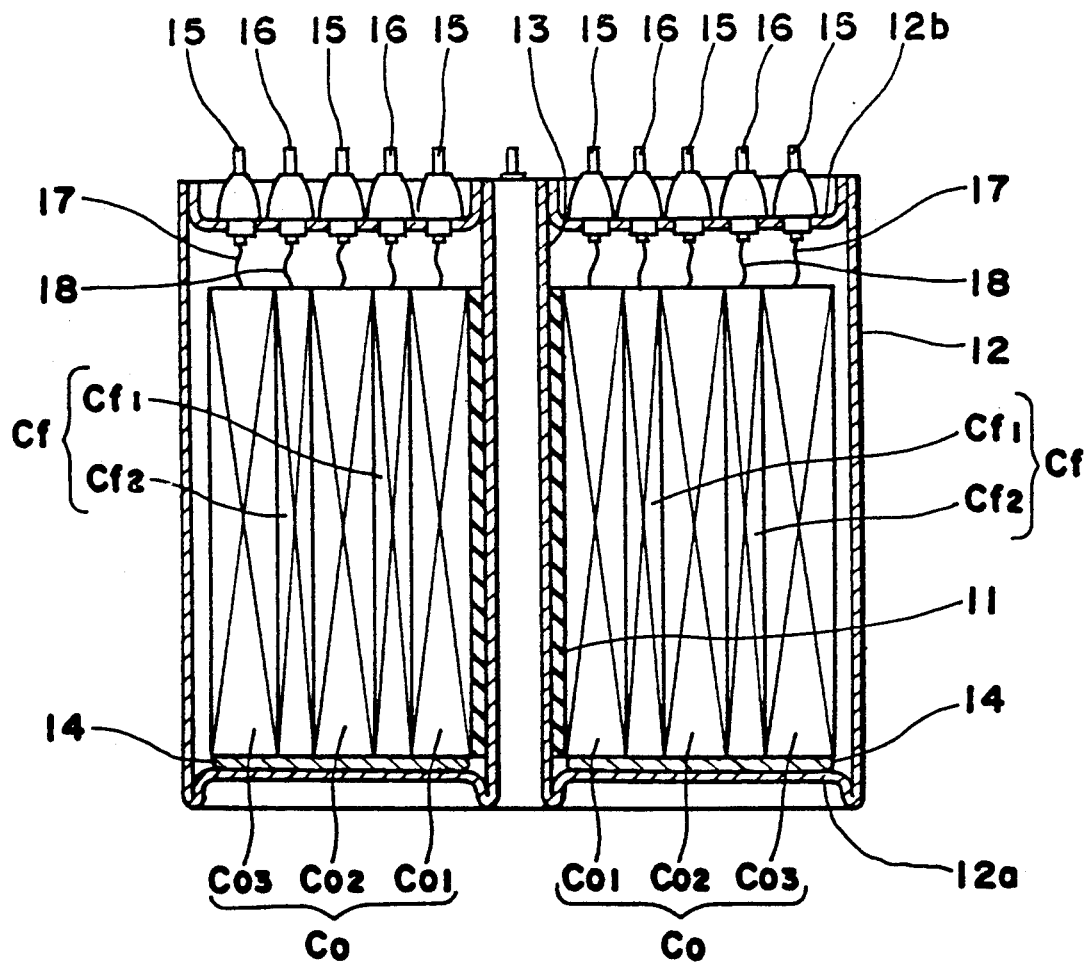
FIG. 5 is a cross sectional view of a coaxial type capacitor according to the second preferred embodiment of the present invention.

FIG. 5 shows another preferred embodiment of the present invention.

In this preferred embodiment, the first capacitor $C_O$ is comprised of three cylindrical capacitors $C_{O1}$, $C_{O2}$ and $C_{O3}$ and the second capacitor $C_f$ is comprised of two cylindrical capacitors $C_{f1}$ and $C_{f2}$ which are inserted between $C_{O1}$ and $C_{O2}$ and between $C_{O2}$ and $C_{O3}$, respectively.

Figure 6:
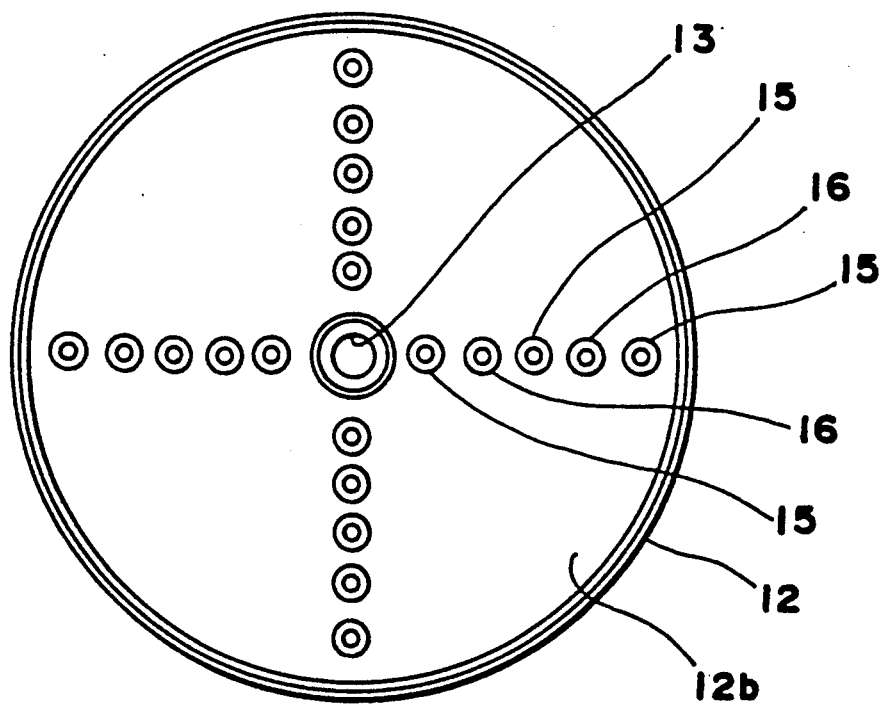
FIG. 6 is a plan view of the coaxial type capacitor shown in FIG. 5.

Further, as shown in FIGS. 5 and 6, in the preferred embodiment, respective output terminals 15 for the first capacitor are arranged on the cover plate 12b so as to be positioned just above the individual capacitors $C_{O1}$, $C_{O2}$ and $C_{O3}$ and respective output terminals 16 for the second capacitor are arranged so as to be positioned just above the individual capacitors $C_{f1}$ and $C_{f2}$. This arrangement for the output terminals contributes to shorten the lead wires of 17, 18 used for connecting the respective capacitors with the output terminals 15, 16.

Figure 7:
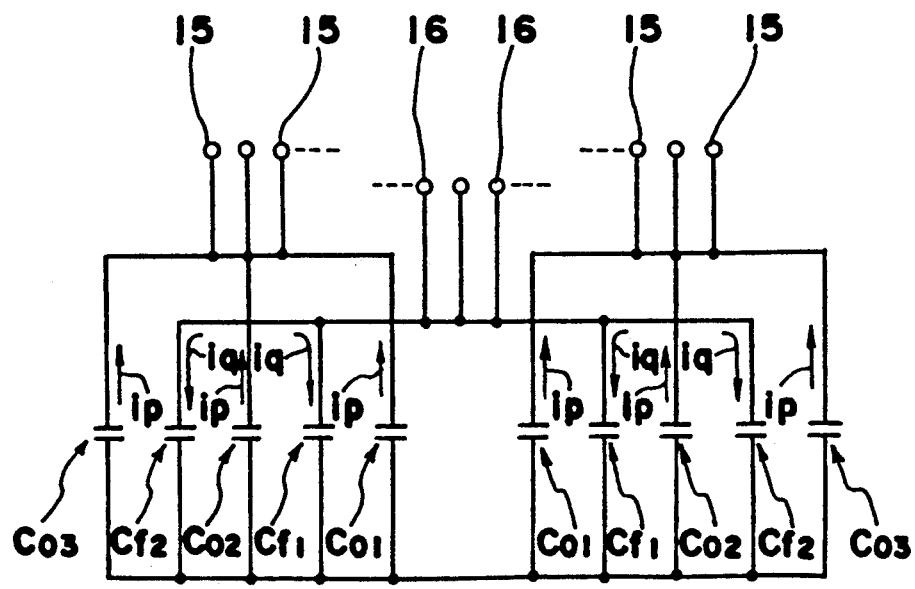
FIG. 7 is an equivalent circuit of the coaxial type capacitor shown in FIG. 5.

As is easily understood from FIG. 7 showing an equivalent circuit of the coaxial capacitor according to the second preferred embodiment of the present invention, the distance between the respective adjacent paths of two currents ip and iq flowing oppositely is shortened and, therefore, the residual inductance L can be reduced further.

According to an experiment made by the inventor of the present invention, the residual inductance L is given by an equation as follows:

$$L \approx K \frac{30}{N} \ (nH)$$

wherein K is a constant falling in a range between 1.2 and 1.5 and N is a number of capacitors which form the first capacitor, namely a number of capacitors into which the first capacitor is divided.

According to this equation, the residual inductance L of the coaxial capacitor shown in FIG. 5 is in a range between 12 and 15 (nH) because N=3 in this case.

Figure 8:
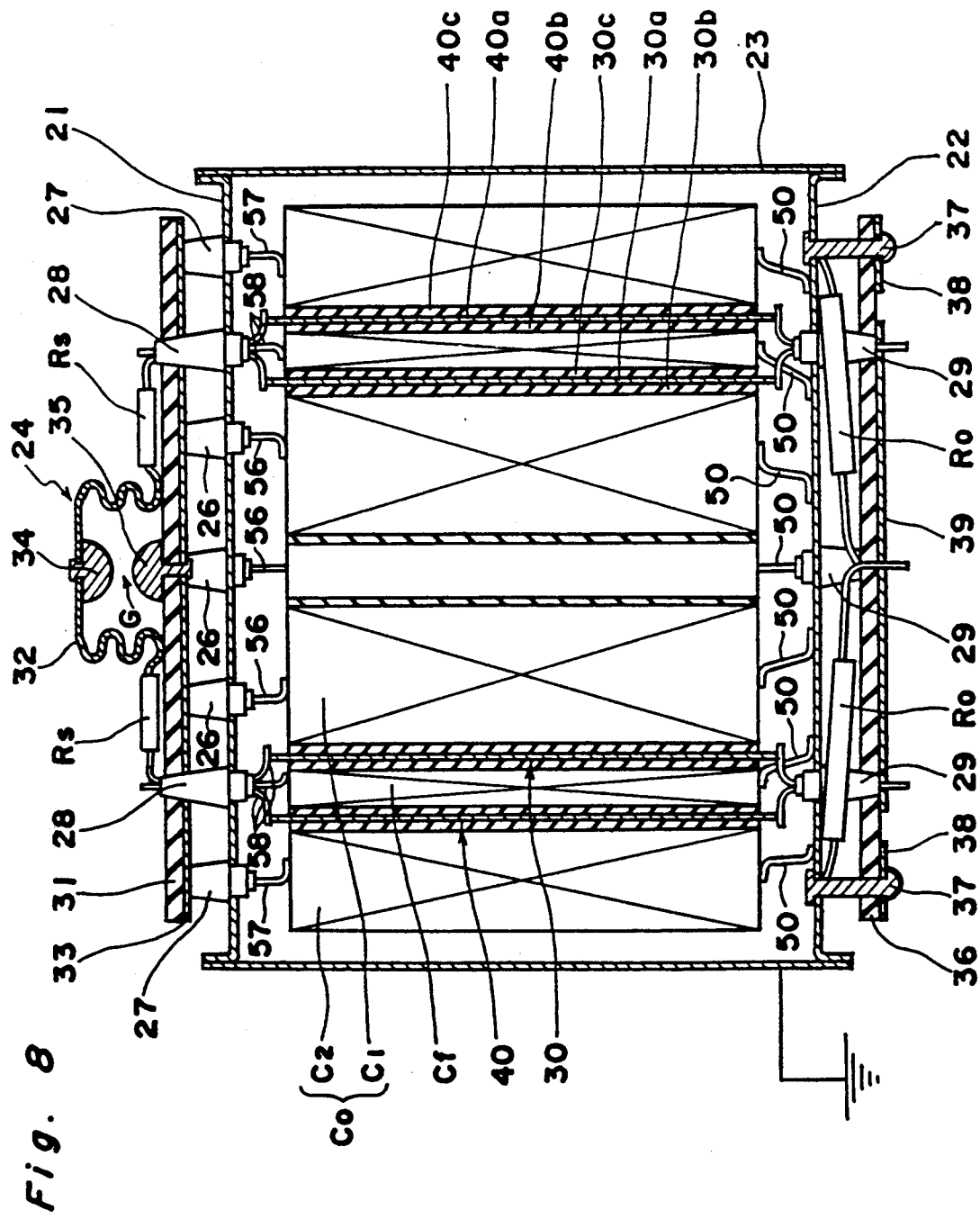
FIG. 8 is a cross sectional view of a pulse generator providing a coaxial type capacitor according to the present invention.

FIG. 8 shows a pulse generator in which the coaxial capacitor according to the present invention is applied.

The pulse generator is essentially comprised of a coaxial capacitor unit formed with three cylindrical capacitors $C_1$, $C_f$ and $C_2$, a metal case 23 including a cover plate 21 and a base plate 22, in which the capacitor unit is contained, a switch means 24 supported on an upper insulation plate 31 which is supported above the cover plate 21, resistors $R_S$ for restraining a high-frequency oscillation which are mounted on the insulation plate 31 and discharging resisters $R_O$ arranged between the base plate 22 and a lower insulation plate 36 which is supported beneath the base plate 22.

The capacitor unit for the pulse generator has a structure similar to that of the capacitor unit shown in FIG. 1, namely, the inner capacitor $C_1$ and the outer capacitor $C_2$ form the first capacitor $C_O$ and the intermediate capacitor forms the second capacitors $C_f$. However, in this present embodiment, first and second cylindrical elements 30 and 40 are inserted between the inner capacitor $C_1$ and the intermediate capacitor $C_f$ and between the intermediate capacitor $C_f$ and the outer capacitor $C_2$, respectively. The first cylindrical element 30 is formed as follows; first, an insulation sheet 30b such as a resin sheet is wound around the inner capacitor $C_1$, then, a conductive sheet 30a such as a metal sheet is wound around the insulation sheet 30b and, finally, another insulation sheet 30c such as a resin sheet is wound around the conductive sheet 30a. The insulation sheets 30b and 30c are provided for insulating the conductive sheet 30a from the inner capacitor $C_1$ and the intermediate capacitor $C_f$, respectively.

The second cylindrically element 40 is formed similarly. Each conductive sheet 30a or 40a is formed to have an axial length so that its upper and lower ends protrude from the upper and lower end surfaces of the respective capacitors $C_1$, $C_f$ and $C_2$.

It is also desirable to use a conductive sheet that is laminated with insulation films on both surfaces thereof, in order to form the cylindrical element.

Figure 10:
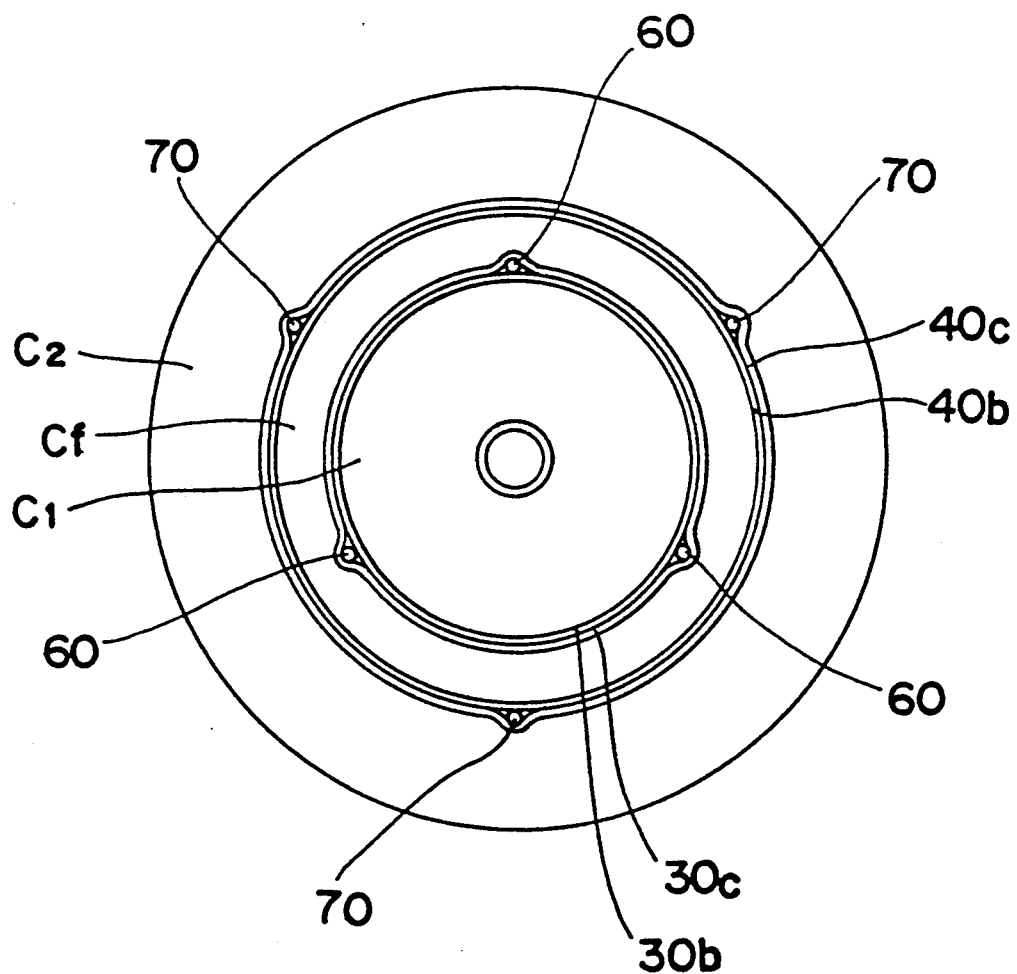
FIG. 10 is a plan view of a capacitor unit according to a variation of the capacitor unit shown in FIG. 8.

Instead of using the cylindrical elements mentioned above, lead wires also can be used. FIG. 10 shows another embodiment of the capacitor unit shown in FIG. 8. In this embodiment, three lead wires 60 are inserted between the insulation sheets 30b and 30c at an equal angular pitch (120°) with respect to the center of the unit. Similarly, three lead wires 70 are inserted between the insulation sheets 40b and 40c. These lead wires are effective in reducing stray capacitances that could arise otherwise. If insulated lead wires are used instead of the conventional lead wires, respective insulation sheets 30b and 30c can be omitted. The number of lead wires does not have to be restricted to three as shown in FIG. 10. All that is required is that the lead wires are arranged symmetrically with respect to the center of the capacitor unit.

On the cover plate 21, first, second and third terminals 26, 27 and 28 are radially arranged above the inner, outer and intermediate capacitors $C_1$, $C_2$, $C_f$, respectively. Each terminal 26, 27 or 28 is comprised of an insulator cone and a lead wire 56, 57 or 58 passing through the insulator cone. The first and second terminals 26 and 27 are connected to one electrode of the inner and outer capacitors $C_1$ and $C_2$ at one respective end via lead wires 56 and 57 and the other respective ends are connected to a metal plate 33 which is laminated on the lower surface of the first insulation support plate 31. Another electrode from each of the inner and outer capacitors $C_1$ and $C_2$ is connected to the base plate 22 of the metal case 23 by a respective lead wire 50. As a result of above-mentioned connections, the inner and outer capacitors $C_2$ and $C_1$ are coupled to form the first capacitor $C_O$.

On the other hand, the insulator cone of the third terminal 28 differs from the insulator core of the first and second terminals 26 and 27 in that it protrudes from the upper insulation plate 31 upwardly and the lower end of the lead wire 58 is divided into three wires to connect the two upper ends of the cylindrical elements 30 and 40 and one electrode of the second (intermediate) capacitor $C_f$ commonly. Each of the lower ends of the cylindrical elements 30 and 40 are connected to a circular electrode plate 39 laminated on the lower surface of the second insulation plate 36 via a lead wire of fourth terminal 29 which is fixed between the base plate 22 and the second insulation plate 36. Another electrode of the second capacitor $C_f$ is connected to the base plate 22 by lead wires 50.

Another end from the lead wire 58 of the third terminal 28 is connected to a metal bellows 32 of the switch means 24 via resistor $R_S$. The metal bellows 32 of the switch means 24 supports a first discharge electrode 34 having a half-spherical shape facing a second discharge electrode 35 of a half-spherical shape with a predetermined gap G separating the two discharge electrodes. The second discharge electrode 35 is fixed on the center of the first insulation plate 31, and is connected to the metal plate 33 of the upper insulation plate 31 by a leg portion thereof extending downwardly. Thus, the switch means 24 is switched on when the metal bellows 32 is pushed down.

Instead of using the flexible metal bellows 32, the first discharge electrode 34 may be supported by a suitable rigid metal element having a gap G between the first and second discharge electrodes 34 and 35. In this embodiment, a trigger electrode (not shown but see FIG. 13) is provided near the first discharge electrode 34 to which a trigger pulse is applied for triggering the switch means 24.

The resistors $R_O$ arranged between the base plate 22 and the second insulation plate 36, are connected between the circular metal plate 39 and a metal ring 38 via rivets 37 which support the second insulation plate 36 from the base plate 22. More specifically, the metal ring 38 encloses the circular metal plate 39 with a gap fixed by the heads of rivets 37 on the second surface of the lower insulation plate 36, and the rivets 37 are connected to the resistors $R_O$ which are connected to the circular metal plate 38 of the second insulation plate 36. The metal case 23 itself is grounded. Therefore an output pulse is generated between the ring metal plate 38 and the circular plate 39.

Figure 9:
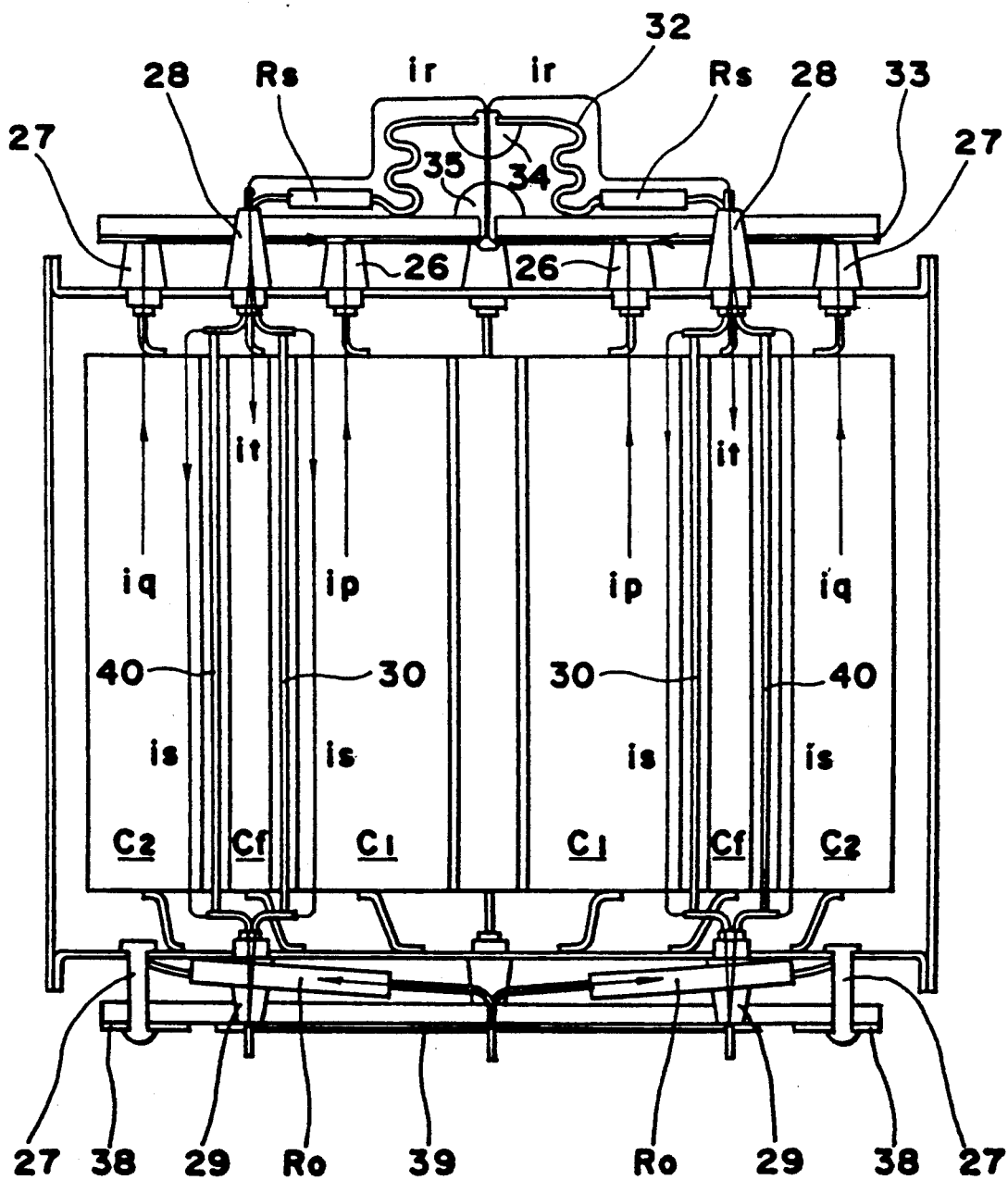
FIG. 9 is an explanatory diagram for showing currents generated in the pulse generator shown in FIG. 8.

To operate the above-mentioned pulse generator, the first capacitor $C_O$ comprised of the inner and outer capacitors $C_1$ and $C_2$ is charged by applying a direct voltage thereto through a resistor for charging (not shown). After charging the first capacitor $C_O$, the switch means 24 is triggered on and the charges accumulated in the inner and outer capacitor $C_1$ and $C_2$ are discharged to generate currents ip and iq, respectively, as shown in FIG. 9. Currents ip and iq flow through the first and second terminals 26 and 27, the metal plate 33 and the switch means 24 to form a total discharge current iy. The total discharge current iy flows into the resistors $R_S$ and, then, via the third terminals 28, it will flow into the second capacitor $C_f$ and the inner and outer cylindrical elements 30 and 40. More specifically, current $i_t$ flows through the second capacitor $C_f$ and respective current $i_s$ flow through the inner and outer cylindrical elements 30 and 40. The current $i_s$ will flow via the fourth terminals 29, and the circular metal plate 39, into the resistors $R_O$ where an output pulse is generated between the circular metal plate 39 and the ring metal plate 38.

As is clearly shown in FIG. 9, the directions of the currents ip and iq are opposite to those of the currents $i_s$ and $i_t$ and these currents are concentric with respect to each other. Accordingly, the inductances induced on the flow paths of currents ip and iq will cancel the inductances induced on the flow paths of currents $i_s$ and $i_t$. This effect will reduce the residual inductance of the pulse generator together with an output impedance of the pulse generator. In order to obtain a high quality pulse having a fast rising time without any high-frequency oscillation the value of the resistor $R_S$ should be minimized to a value as small as possible, while still maintaining its function of restraining high-frequency oscillations.

The advantages of the two cylindrical elements 30 and 40 will be explained with reference to FIGS. 11 and 12.

Figure 11A:
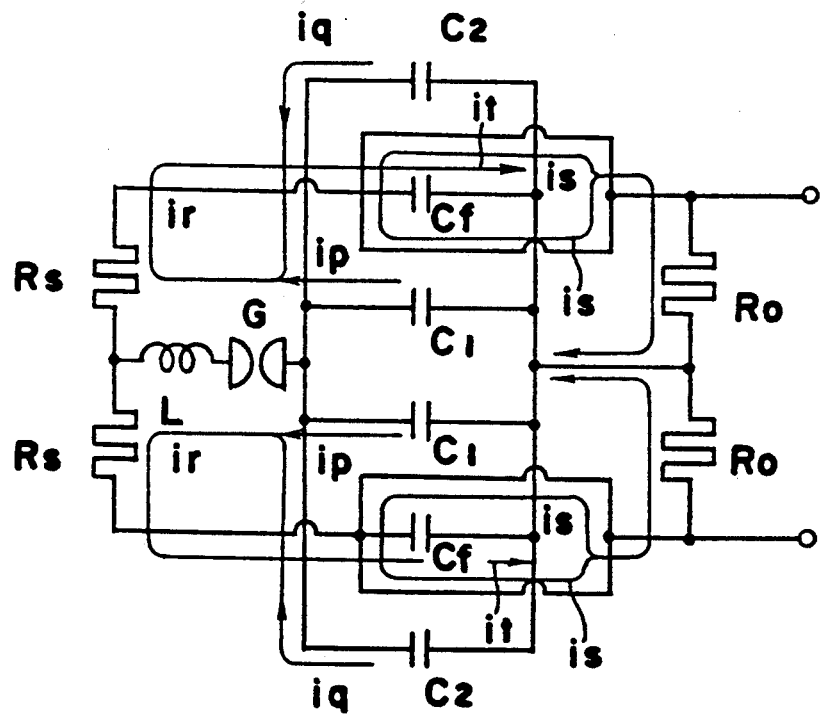
FIG. 11(a) is an equivalent circuit of the pulse generator shown in FIG. 8.
Figure 12A:
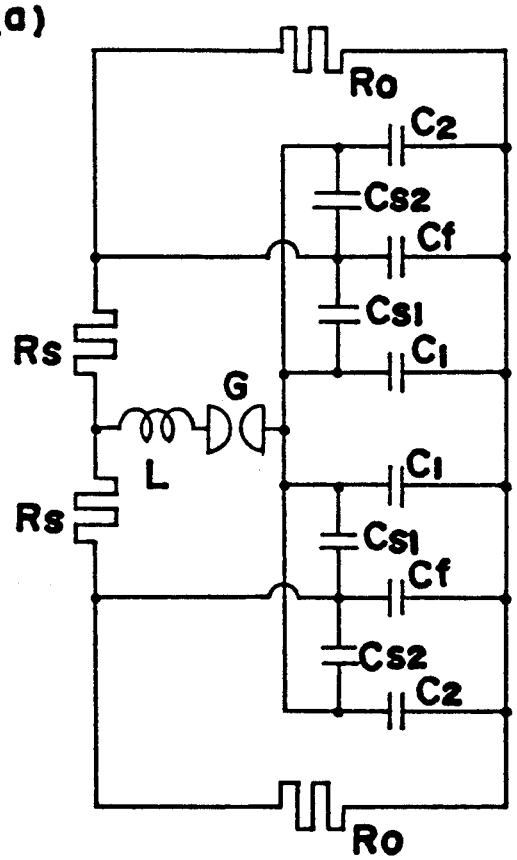
FIG. 12(a) is an equivalent circuit of a pulse generator wherein no cylindrical element is used.

FIG. 11(a) shows an equivalent circuit of a pulse generator wherein two cylindrical elements are used according to the preferred embodiment as shown in FIG. 8. FIG. 12(a) shows an equivalent circuit of a pulse generator wherein cylindrical elements are not used.

Figure 11B:
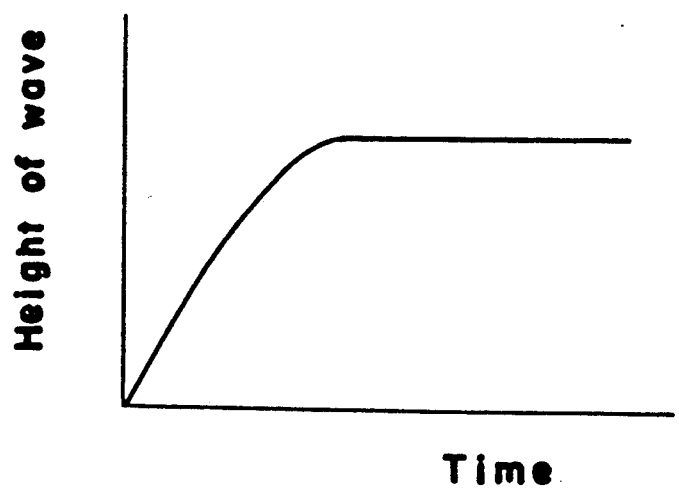
FIG. 11(b) is a graph for showing an output pulse generated by the pulse generator according to the present invention.

The pulse generator with two cylindrical elements shown in FIG. 11(a), will not have any stray capacity induced and, therefore, an output pulse can rise smoothly as shown in FIG. 11(b).

Figure 12B:
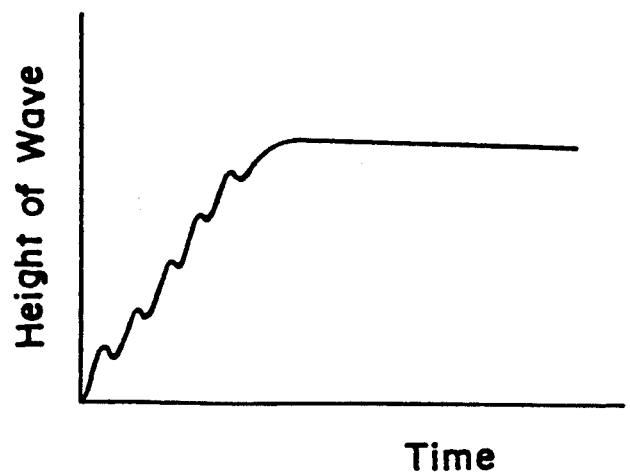
FIG. 12(b) is a graph for showing an output pulse generated by the pulse generator having the equivalent circuit shown in FIG. 12(a)
Figure 14A:
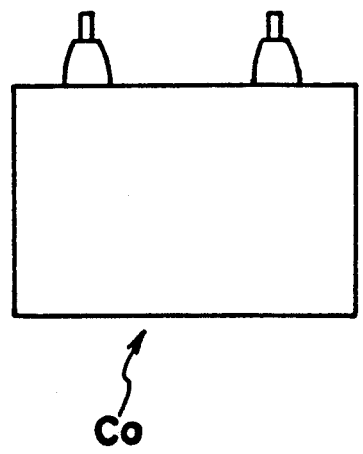
FIGS. 14(a) and 14(b) are side-elevational views for showing capacitors $C_O$ and $C_f$ used in a conventional pulse generator.
Figure 14B:
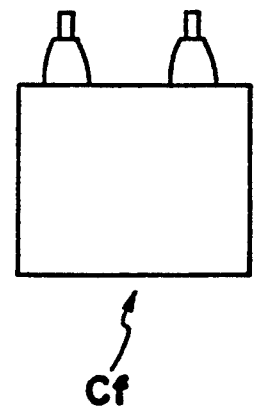
Figure 15:
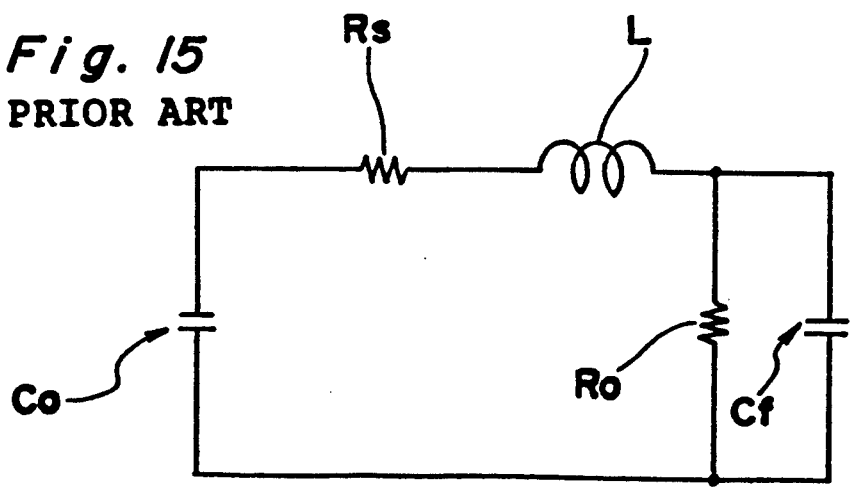
FIG. 15 is an equivalent circuit of a conventional pulse generator for showing a residual inductance generated upon discharge of the capacitor $C_O$.

Contrary to the pulse generator shown in FIG. 11(a), FIG. 12(a) discloses two stray capacities $C_{S1}$ and $C_{S2}$ that are induced. As a result of the capacities, a high-frequency oscillation signal is generated upon the rise of the pulse as shown in FIG. 12(b).

The pulse generator according to the preferred embodiment of the present invention shows a residual inductance smaller than one-hundredth of that of a conventional pulse generator and also a rising time smaller than one-tenth of the latter.

The preferred embodiments described herein are illustrative and not restrictive, the scope of the invention being indicated by the appended claims and all variations which come within the meanings of the claims are intended to be embraced herein.

What is claimed is:

1. A pulse generator comprising a coaxial type capacitor, said capacitor including at least a first capacitor which discharges a charge accumulated therein when a pulse is generated and a second capacitor which adjusts a waveform of a pulse to be outputted, wherein said coaxial type capacitor includes at least said first and second capacitors, and also a third capacitor, said three capacitors being arranged coaxially and adjacently with each other, wherein said first and third capacitors between which said second capacitor is arranged are connected in parallel so as to form the discharging capacitor of the pulse generator, said second capacitor being the waveform adjusting capacitor, and wherein currents in said first and third capacitors flow in an opposite direction to that of a current in said second capacitor when a pulse is generated; and further comprising:

charging and switching means for charging and discharging said first capacitor and thereby forming an output current pulse of said pulse generator.

2. A pulse generator according to claim 1, wherein said first, second and third capacitors are cylindrical capacitors.

3. A pulse generator according to claim 1, wherein said first, second and third capacitors are film capacitors.

4. A pulse generator according to claim 1, further including a metal shield case for containing said first, second and third capacitors in a shielded state.

5. A pulse generator according to claim 4, wherein said metal shield case is comprised of a cylindrical body having a bottom plate, a central pipe which is fixed concentric with said cylindrical body and a cover plate for covering an upper aperture of said cylindrical body.

6. A pulse generator according to claim 5, wherein a plurality of insulator cones are arranged radially on said cover plate through which respective lead wires are led out and each of the lead wires is connected to one of said first, second and third capacitors.

7. A pulse generator according to claim 1, further including at least one conductive element which is held in an insulated state at least between said first and second capacitors or between said second and third capacitors and said at least one conductive element is connected commonly to respective electrodes of said second capacitor.

8. A pulse generator according to claim 7, wherein said conductive element is a conductive sheet wound cylindrically.

9. A pulse generator according to claim 7, wherein said conductive element is comprised of a plurality of lead wires arranged at an equal angular pitch with respect to the center of the coaxial type capacitor.

10. A pulse generator according to claim 1, further comprising conductive shield means within said coaxial type capacitor for reducing stray capacitance therein.

11. A pulse generator according to claim 1, further comprising:

resistance means for inhibiting oscillation in said pulse generator and for grounding said discharged current pulse to form a voltage pulse output.

12. A pulse generator according to claim 11, wherein said resistance means comprises a first resistance in series with said charging capacitor, and a second resistance in series with said waveform adjusting capacitor.

13. A pulse generator comprising a coaxial type capacitor, said capacitor including at least a first capacitor which discharges a charge accumulated therein when a pulse is generated and a second capacitor which adjusts a waveform of a pulse to be outputted, wherein said coaxial type capacitor includes at least said first and second capacitors, and also third to fifth capacitors, said five capacitors being arranged coaxially with each other in that order, wherein said first, third and fifth capacitors are connected in parallel with each other to form the discharging capacitor of the pulse generator, wherein said second and fourth capacitors are connected in parallel with each other to form the waveform adjusting capacitor, wherein currents in said first, third and fifth capacitors flow in a direction opposite to that of currents in said second and fourth capacitors when a pulse is generated, and further comprising:

charging and switching means for charging and discharging said first capacitor and thereby forming an output current pulse of said pulse generator.

14. A pulse generator comprising:

a first charging capacitor having a cylindrical structure;

a waveform adjusting capacitor having a cylindrical structure arranged coaxially with said first charging capacitor;

a second charging capacitor having a cylindrical structure arranged coaxially with said first charging capacitor and said waveform adjusting capacitor;

a pair of conductive shield means each having two ends and being inserted respectively between said first charging capacitor and said waveform adjusting capacitor, and between said waveform adjusting capacitor and said second charging capacitor, each of said conductive shield means being insulated from both of said capacitors between which is it inserted;

a cylindrical metal case containing said three capacitors and said conductive shield means therein and having respective openings at its two ends;

first cover means covering one of said openings of said metal case and having first, second and third terminal groups thereon, said first and second terminal groups being connected respectively to a first electrode of each of said first and second charging capacitors, said third terminal group being connected to a first electrode of said waveform adjusting capacitor and to one end of each said conductive shield means;

second cover means covering the other opening of said metal case and having thereon a fourth terminal group connected to the other ends of said conductive shield means, said second cover means being connected to second electrodes of said first and said second charging capacitors and said waveform adjusting capacitor;

switch means having first and second contacts, said second contact being connected to said first and second terminal groups, for being turned on to discharge said first and second charging capacitors by bringing said two contacts together;

a first resistance connected between said third terminal group and the first contact of said switch means; and a second resistance connected between said second cover means and said fourth terminal group;

wherein an output pulse of said pulse generator appears between said fourth terminal group and said metal case; and wherein currents in said first and second charging capacitors flow in an opposite direction to that of a current in said waveform adjusting capacitor when an output pulse is generated.

15. A pulse generator according to claim 14, wherein said conductive shield means are insulated from said first and second charging capacitors and said waveform adjusting capacitor by insulation sheets.

16. A pulse generator according to claim 15, wherein said conductive shield means have an axial length such that upper and lower ends thereof protrude from upper and lower end surfaces of said first and second charging capacitors and said waveform adjusting capacitor and toward said first and second cover means.

17. A pulse generator according to claim 16, wherein said conductive shield means comprise cylindrically wound sheets.

18. A pulse generator according to claim 16, wherein said conductive shield means each comprise a plurality of wires arranged with respect to said first and second charging capacitors and said waveform adjusting capacitor so as to reduce stray capacitance therebetween.

19. A pulse generator according to claim 14, wherein said first, second and third terminals are arranged radially symmetrically with respect to said first and second charging capacitors and to said waveform adjusting capacitor.

20. A pulse generator according to claim 14, wherein said first cover means comprises a first metal plate electrically connected to said first and second terminals, and to said second contact of said switch means.

21. A pulse generator according to claim 20, wherein said first, second and third terminals comprise insulator cones arranged on said first cover means and having respective lead wires passing therethrough which are connected respectively to said first and second charging capacitors and said waveform adjusting capacitor.

22. A pulse generator according to claim 21, wherein said first cover means further comprises a first insulation plate; said first insulation plate being attached to said first metal plate; and wherein the insulator cone and lead wire of said third terminal protrude upwardly through said first metal plate and said first insulation plate of said first cover means and said lead wire is electrically connected to said first contact of said switch means via said first resistance.

23. A pulse generator according to claim 22, wherein said switch means comprises a metal bellows supporting said first contact which is a first discharge electrode, opposing said second contact which is a second discharge electrode which is fixed onto said first insulation plate of said first cover means and extends downward therethrough to said first metal plate; said first and second discharge electrodes having a predetermined gap therebetween; said switch being turned on to discharge said first and second charging capacitors, after said first and second charging capacitors have been charged, by pushing down said bellows.

24. A pulse generator according to claim 23, wherein said first and second discharge electrodes are of half spherical shape.

25. A pulse generator according to claim 14, wherein said first and second charging capacitors are chargeable by applying a DC voltage thereto.

26. A pulse generator according to claim 14, wherein said switch means comprises a metal bellows supporting said first contact which is a first discharge electrode, opposing said second contact which is a second discharge electrode which is fixed on said first cover means; said first and second discharge electrodes having a predetermined gap therebetween; said switch being turned on to discharge said first and second charging capacitors, after said first and second charging capacitors have been charged, by pushing down said bellows.

27. A pulse generator according to claim 26, wherein said first and second discharge electrodes are of half spherical shape.

28. A pulse generator according to claim 14, wherein said switch means comprises a trigger electrode near a first discharge electrode opposing a second discharge electrode fixed on said first cover means; said first and second discharge electrodes having a predetermined gap therebetween; said trigger electrode providing a pulse to trigger said switch means.

29. A pulse generator according to claim 28, wherein said first and second discharge electrodes are of half spherical shape.

30. A pulse generator according to claim 14, wherein said second cover means comprises a second metal plate electrically connected to said fourth terminals and to said second resistance, and said output pulse appears between said second metal plate and said metal case.

31. A pulse generator according to claim 30, wherein first and second discharge currents appear at said first and second terminals and form a total discharge current flowing through said switch means and said first resistance to said waveform adjusting capacitor via said third terminal; said total discharge current also flowing via said conductive shield means to said fourth terminals.

32. A pulse generator according to claim 30, wherein said second cover means further comprises a second insulating plate attached to said second metal plate, and a third metal plate on said second insulating plate electrically connected to said metal case.

33. A pulse generator comprising:
capacitor means comprising charging means for being charged by having a voltage applied thereto; and waveform adjusting means for shaping a waveform of a current pulse discharged from said capacitor means;
wherein said charging means comprises a first charging capacitor having a cylindrical structure, said waveform adjusting means comprises a waveform adjusting capacitor having a cylindrical structure arranged coaxially with said first charging capacitor, and said charging means further comprises a second charging capacitor having a cylindrical structure arranged coaxially with said first charging capacitor and said waveform adjusting capacitor;
conductive shield means within said capacitor means for reducing stray capacitance therein;
charging and switching means for charging and discharging said charging means; and
resistance means for inhibiting oscillation in said pulse generator and for grounding said discharged current pulse to form a voltage pulse output;
wherein currents in said first and second charging capacitors flow in an opposite direction to that of a current in said waveform adjusting capacitor when an output pulse is generated.

34. A pulse generator according to claim 33, wherein said conductive shield means comprises conductive sheets inserted respectively between said first charging capacitor and said waveform adjusting capacitor and between said waveform adjusting capacitor and said second charging capacitor.

35. A pulse generator according to claim 33, wherein said conductive shield means comprises elongated metal elements disposed between said first charging capacitor and said waveform adjusting capacitor and between said waveform adjusting capacitor and said second charging capacitor.

36. A pulse generator according to claim 33, further comprising a cylindrical metal case having two ends and first cover means covering a first one of said ends of said cylindrical case, said first cover means having first, second and third terminal groups thereon, said first and second terminal groups being connected respectively to first electrodes of each of said first and second charging capacitors, said third terminal group being connected to a first electrode of said waveform adjusting capacitor and to one end of each of said conductive shield means.

37. A pulse generator according to claim 36, wherein said resistance means comprises a first resistance connected between said third terminal group and said switching means.

38. A pulse generator according to claim 33, wherein said cylindrical case has second cover means covering the other end of said cylindrical case, said second cover means having a fourth terminal group connected to the other ends of said conductive shield means, said second cover means being connected to a second electrode of each of said first and second charging capacitors and of said waveform adjusting capacitor.

39. A pulse generator according to claim 38, wherein said resistance means comprises a second resistance connected between said second cover means and said fourth terminal group.

* * * * *